United States Patent [19]
Nagami et al.

[11] 3,946,249
[45] Mar. 23, 1976

[54] SIGNAL CONTROL CIRCUIT

[75] Inventors: Masaru Nagami; Osami Niino, both of Yokohama, Japan

[73] Assignee: Sony Corporation, Tokyo, Japan

[22] Filed: May 11, 1973

[21] Appl. No.: 359,217

[30] Foreign Application Priority Data
May 13, 1972 Japan.......................... 47-56182[U]

[52] U.S. Cl................. 307/233 A; 307/254; 328/26
[51] Int. Cl.² ........................................ H03K 17/00
[58] Field of Search ........ 328/26, 54; 307/236, 233, 307/262, 254

[56] References Cited
UNITED STATES PATENTS

| | | | |
|---|---|---|---|
| 2,580,020 | 12/1951 | Hammond, Jr. ..................... | 330/141 |
| 2,678,387 | 5/1954 | Volz...................................... | 328/26 |
| 2,972,677 | 2/1961 | Meadows............................. | 328/167 |
| 3,151,299 | 9/1964 | Smith................................... | 328/54 |
| 3,238,383 | 3/1966 | Falk ..................................... | 328/26 |
| 3,289,007 | 11/1966 | Zydney ............................... | 328/26 X |

*Primary Examiner*—Stanley D. Miller, Jr.
*Assistant Examiner*—B. P. Davis
*Attorney, Agent, or Firm*—Lewis H. Eslinger; Alvin Sinderbrand

[57] ABSTRACT

A circuit to control the frequency response of a variable filter by means of a control signal based on the amplitude of the information signal to minimize the effect of noise in a signal transmission system. The variable filter is connected to an output circuit of an information signal amplifier and may feed the frequency-modified information signal to a system output terminal, if the system is to compress the dynamic range of the information signal by amplifying low amplitude signals more than high amplitude signals. Alternatively, the filter may feed the frequency-modified signal back to the input of the amplifier by way of connecting means, such as switch, to expand the dynamic range. Control of the filter for low frequency signals is achieved by rectifying and filtering the signals to the control amplifier. Negative-going transients are inverted and by-pass the rectifier and filter and are applied directly to the control amplifier. Positive-going transients are applied through the filter and are not inverted.

11 Claims, 6 Drawing Figures

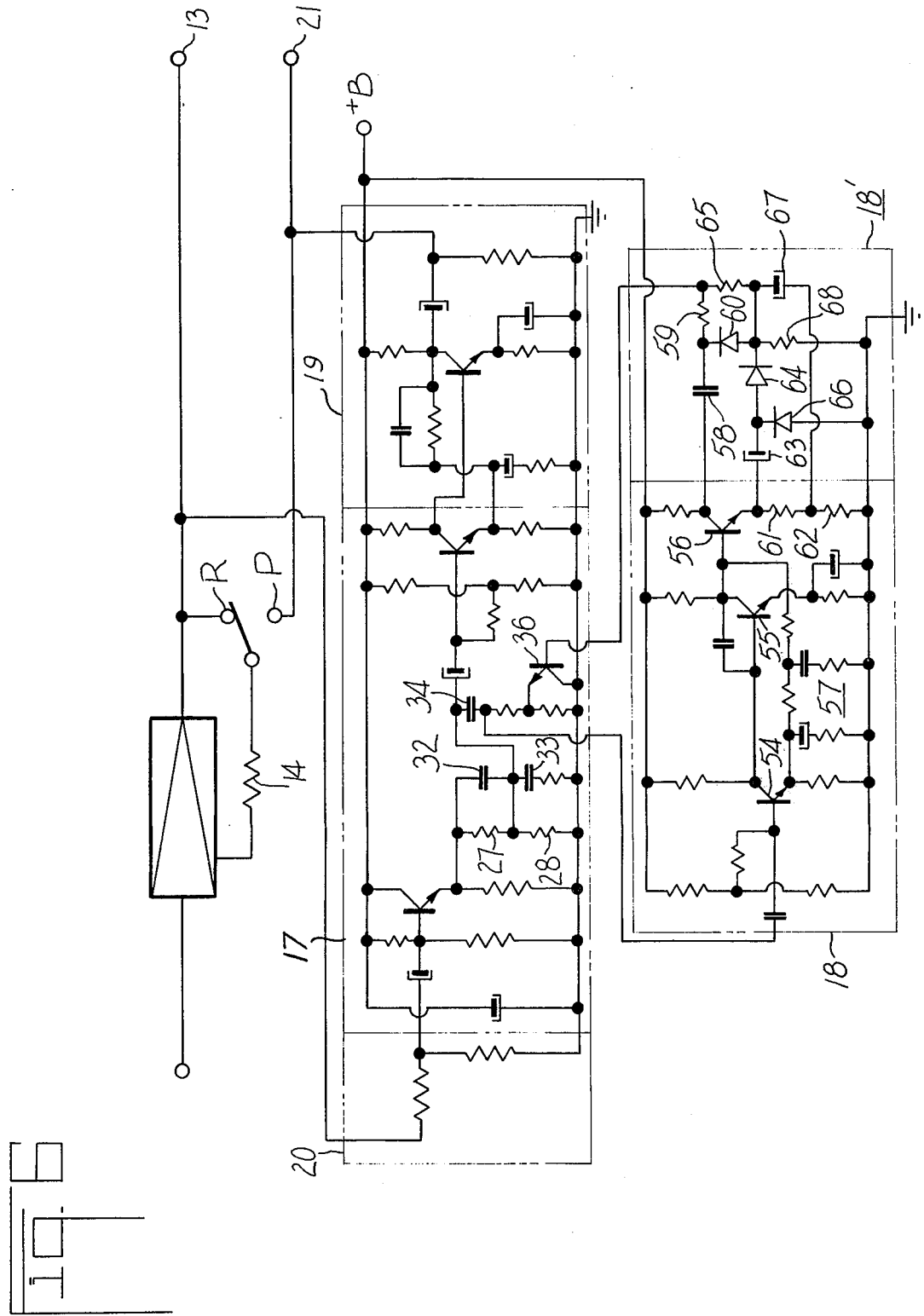

SIGNAL CONTROL CIRCUIT

BACKGROUND OF THE INVENTION

1. Field of the Invention

This invention relates to a control circuit for a noisereducing signal transmission system of a type suitable for a tape recorder or the like and, in particular, it relates to a circuit with good transient response to suppress or eliminate noise superimposed on a signal between the recording and playback thereof.

2. The Prior Art

In the system described in a copending application Ser. No. 274,667, filed July 24, 1972, and now abandoned, it is stated that electrical information signals are, as a general matter, subject to having noise signals superimposed on them as these information signals are transmitted through a system or a series of systems from the point of generation to the point of reproduction. The term "system" is used to designate any means that may affect the passage of the signals and may be simple or complex. Various techniques have been proposed heretofore to combat the effects of such noise signals and particularly to combat noise introduced by the recording medium and apparatus in the case of systems in which the signals are recorded on magnetic tape or other recording media. Such noise is not uniformly distributed throughout the information signal frequency range, and it is possible to reduce the effect of this noise by controlling the frequency response characteristics of the system. However, it is desirable to retain a proper overall frequency response characteristic for the information signal, which means that any enhancement of the signal in one part of the system should be compensated by a reduction of the signal amplitude in another part of the system.

In the system described in the said copending application an output circuit of a signal amplifier is connected to a variable filter, that is, a filter having a variable frequency response characteristic that can be changed on a dynamic basis. The amplitude of the signals from the amplifier is modified by the variable filter in accordance with the instantaneous frequency response of the filter. The filter has a frequency response that attenuates one band of frequencies relative to another, i.e., low frequency signals relative to high frequency signals, within the complete range of the information signals. The filter is so arranged that the attenuation of signals at the low frequency end of the band is relatively constant, and the attenuation of the high frequency signals is also relatively constant, but between the low frequency and high frequency signals is a transition range in which the attenuation varies between the upper and lower limits. Furthermore, a control circuit is connected to the filter and is also connected to receive information signals to control the characteristics of the filter in such a way that the transition range can be shifted toward the high frequency end of the overall band or toward the low frequency end, depending on the amplitude of the information signals.

When such a system is to be used to record the information signals on a recording medium, such as magnetic tape, signals that have passed through the amplifier and the variable filter are made available at a system output circuit, such as a recording transducer. A negative feedback circuit may be connected from an output circuit to an input circuit of the amplifier when the system is part of a recorder.

On the other hand, if the amplifier and variable filter with its control circuit are to be used in a reproducing system, the output of the variable filter is connected back to an input circuit of the amplifier so that the variable filter is part of a negative feedback loop. In that case the signals that are more attenuated by the filter, will provide less negative feedback for the amplifier and thus will result in a higher output amplitude in the output circuit of the amplifier than those signals that are attenuated less by the filter. The output circuit of the amplifier arranged in this manner, may then be connected to a loud speaker or any other desired further circuit or load. These circuit components can be incorporated into a single device, such as a device for recording signals on tape and playing such signals back by providing a switch between the output of the filter and an input circuit of the amplifier. When this switch is closed, the signals from the filter are fed back to the amplifier; when it is open, these signals are not fed back to the input of the amplifier but may be applied to a recording head.

In particular, for reducing hiss generated by magnetic tape in a tape recorder, the variable filter is arranged so that when the information signal is in the high frequency portion of the overall band and at the same time has a relatively low amplitude, it will be amplified more than another signal of equal amplitude at the low frequency end of the overall frequency band. At an intermediate range of frequencies, the amplification will be dependent upon the precise frequency and will be between the maximum amplification of the high frequency signals and the minimum amplification of the low frequency signals. As the incoming signal increases in level, the transition band shifts so that the amplification of signals within the transition band will be reduced. In a reproducing system according to the present invention, the amplification of a high frequency, low level signal will be less than the amplification of a low frequency, low level signal. The transition band will be the same as in the recording system. Thus, the use of the same components for both recording and reproduction produces equal and opposite effects on the information signals.

It is desirable that the frequency response of the filter be controlled in response to high frequency, or transient, portions of the information signals as well as to low frequency portions. However, in the control amplifier of the aforesaid copending application, there is a smoothing filter to smooth out sharp variations in signal level. This makes the control amplifier non-responsive to transient signals. While the transient signals could be connected around or in parallel with the filtered signals, they must also have the same polarity as the filtered signals.

It is one of the objects of the present invention to provide a control circuit that not only includes means for rectifying and smoothing an incoming signal but also means for adding rapidly changing portions and doing so in the same polarity as the filtered signals, no matter which polarity the rapidly changing signals have.

BRIEF DESCRIPTION OF THE INVENTION

In the circuit of the aforesaid application, a rectifier and filter are provided to respond to the incoming, or information, signal and produce a relatively smooth signal of only one polarity at an output terminal. In the circuit of the present invention means, such as a transistor amplifier with both emitter and collector output circuits is connected between the source of incoming signal and the rectifier. The rectifier is connected to one of the transistor output circuits and a second rectifying circuit is connected to the other output circuit but is so polarized that its output signal has the same polarity as the filtered signal. The circuit parameters of the second rectifying circuit permit it to respond to much higher frequency signals than can pass through the filter, and these higher frequency signals are added in the same polarity as the filtered signals at the output terminal.

For incoming transients of the opposite polarity, a third rectifying circuit is provided and is connected to the same output terminal as the first rectifying circuit. For example, the transistor emitter load may be in two series-connected parts with the first rectifying circuit connected to rectify the voltage across one of the parts. In effect, the third rectifying circuit allows only transient signals of the desired polarity to be added to the filtered signal. Thus transients of one polarity in the incoming signal are added to the filtered signal by way of the second rectifying circuit and transients of the opposite polarity in the incoming signal are added to the filtered signal by way of the third rectifying circuit. In each instance, the transient signals through the second and third rectifying circuits have the same polarities at their outputs as the filtered signals and are additive at the output terminal of the control amplifier circuit.

BRIEF DESCRIPTION OF THE DRAWINGS

FIG. 6 is a schematic diagram of one embodiment of the control amplifier in FIG. 1 according to the present invention.

DETAILED DESCRIPTION OF THE INVENTION

Figure 1:
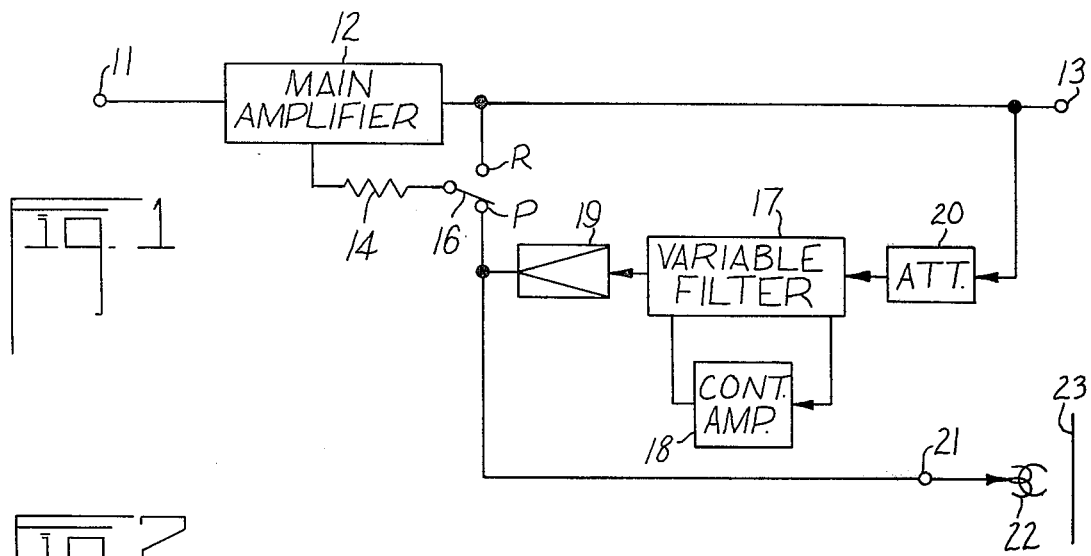
FIG. 1 is a block diagram of a signal transmission system utilizing the control circuit of the present invention.

FIG. 1 shows a signal transmission system which is capable of reducing the effect of certain noise signals on an information signal. The system shown in FIG. 1 can be used either in the section of the signal path that precedes the introduction of the noise to be minimized or in the part of the signal path that follows the introduction of such noise.

The circuit in FIG. 1 includes an input terminal 11 connected to the input circuit of the main amplifier 12 which has an output circuit connected to an output terminal 13. A feedback element 14 is also connected to an input circuit of the amplifier 12. This may be the same input circuit as that connected to the terminal 11 or it may be another part of the input section of the main amplifier 12. The feedback element 14, which is here shown as a resistor, is connected to the arm of a switch 16 that has two stationary poles identified by the letters R and P corresponding to the fact that when the circuit is to be used to record information signals on magnetic tape, the switch arm will be in connection with the R terminal and when the circuit is to be used to play back signals previously recorded on a magnetic tape, the arm of the switch 16 will be in contact with the terminal P, which is the position shown in FIG. 1.

A variable filter 17 is connected to the terminal 13 to recieve the output signals of the main amplifier 12. The variable filter will be described in detail hereinafter and at the moment it is sufficient to note that the frequency-response characteristics of the variable filter are dynamically controlled by a control amplifier 18. The output of the variable filter 17 is applied to a compensating amplifier 19, the gain of which may be set to compensate for the attenuation of an attenuator 20 and the filter 17. The output of the compensating amplifier 19 is connected to the terminal P of the switch 16 and is also connected to a system output terminal 21 which in turn is connected, in the present embodiment, to a magnetic recording head, or transducer, 22. This transducer is located in position to record information on magnetic tape 23, only a short length of which is shown in the drawing.

Figure 2:
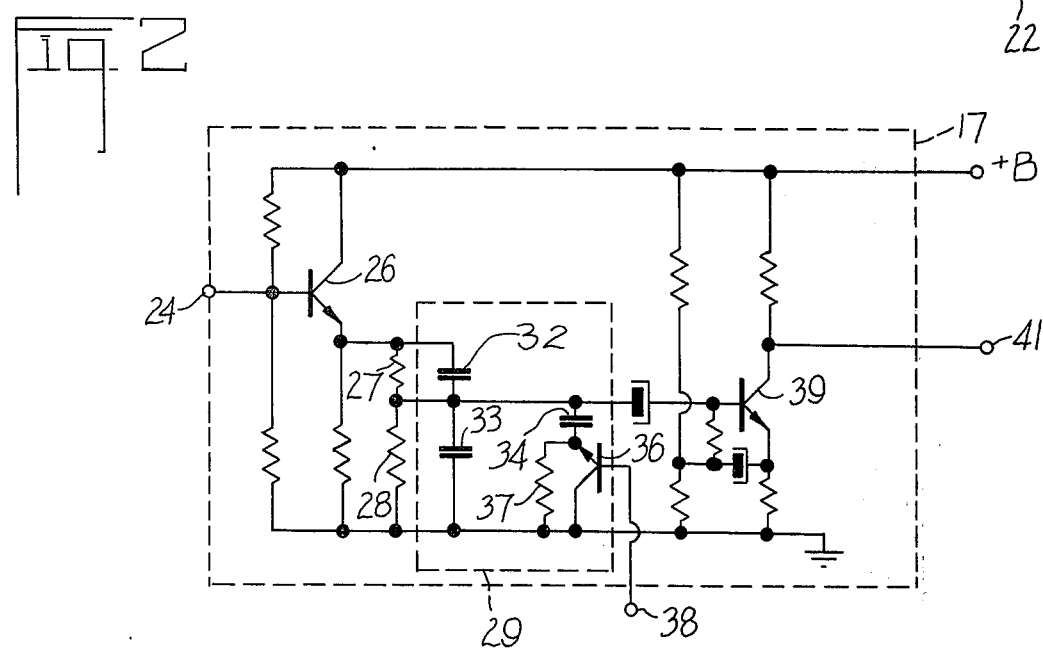
FIG. 2 is a schematic diagram of the variable filter in FIG. 1.

The circuit shown in FIG. 2 is the variable filter 17 of FIG. 1 and includes an input terminal 24 connected to the base of a first transistor 26 which is connected as an emitter-follower to provide a low output impedance. Resistors 27 and 28 are connected as a voltage divider between the emitter of the transistor 26 and ground and compensate the filter characteristics, and particularly in the low frequency part of the band. The actual filtering elements are included within a subcircuit 29 and comprise a pair of capacitors 32 and 33 connected in parallel with the resistor 27 and 28 as a voltage divider. In addition, the filtering elements include a third capacitor 34, one terminal of which is connected to the junction between the capacitors 32 and 33, and the other terminal of which is connected to the emitter of a transistor 36, the collector of which is connected to ground. The emitter-collector circuit of the transistor 36 is in parallel with a resistor 37 and the base of the transistor 36 is connected to a control signal input terminal 38. The maximum impedance between the capacitor 34 and ground, in case transistor 36 reaches cutoff, is limited by the resistor 37 to maintain the desired two-level response characteristics shown in FIG. 3.

The subcircuit 29 is connected to the base of a transistor 39 that has a relatively high input impedance. The output signal of the variable filter circuit 17 is derived from a terminal 41 connected to the collector of the transistor 39.

The subcircuit 29, together with the resistors 27 and 28, is a high pass filter. The frequency-response of this filter is varied by the impedance presented by the emitter-collector circuit of the transistor 36 and this, in turn, is controlled by the amplitude of the control signal applied to the terminal 38. For low amplitude control signals that only drive the base of the transistor 36 slightly above ground voltage, the transistor has relatively low conductivity. As the amplitude of the control signals applied to the terminal 38 increases, the transistor 36 becomes more conductive.

Figure 3:
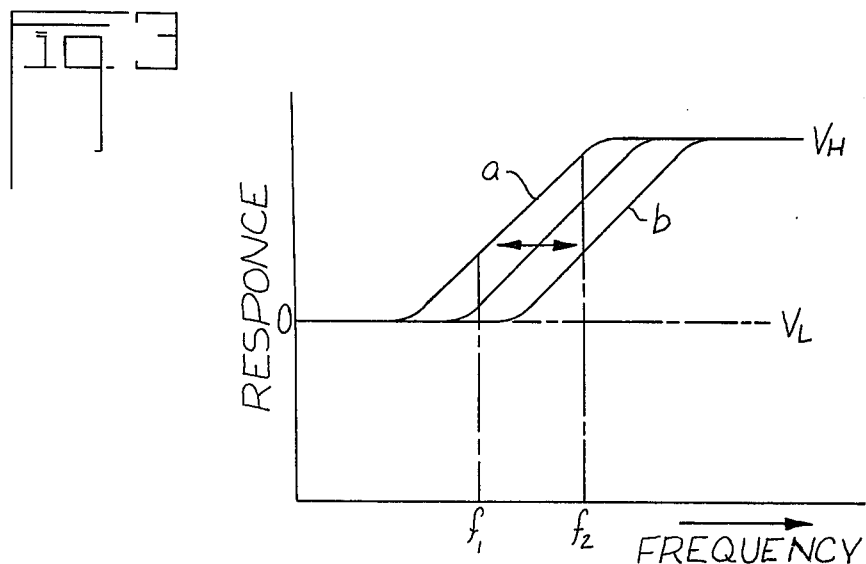
FIG. 3 is a frequency-response curve of the signal transmission system of FIG. 1 when used as a recorder.

The frequency-response of the filter 17 is basically illustrated by the response curve shown in FIG. 3. The upper level $V_H$, which is the output voltage, is related to the input voltage, which may be designated as $e_{in}$, by the equation $$V_H = \frac{Z_{33}}{Z_{32} + Z_{33}} e_{in}$$

where $Z_{32}$ and $Z_{33}$ are the impedances of the condensers 32 and 33, respectively. This equation indicates that the capacitors 32 and 33 are simply acting as a voltage divider in establishing the upper voltage $V_H$. On the other hand, the relationship of the lower level voltage $V_L$ to the input voltage $e_{in}$ is given by the equation $$V_L = \frac{Z_{33} \parallel Z_{34}}{Z_{32} + Z_{33} \parallel Z_{34}} e_{in}$$

where the symbol $Z_{33} \parallel Z_{34}$ indicates the impedance of the parallel connection of the capacitors 33 and 34. The cutoff frequencies $f_L$ and $f_H$ where the sloping parts of the curves in FIG. 3 intersect the voltage levels $V_L$ and $V_H$, respectively, are given by the equations $$f_L \approx \frac{1}{2\pi C_{34} Z_{36}}$$

$$f_H \approx \frac{1}{2\pi (C_{32} + C_{33}) Z_{36}}$$

where $C_{32}$, $C_{33}$, and $C_{34}$ are the capacitances of the capacitors 32, 33, and 34, respectively, and the symbol $Z_{36}$ is the output impedance of the transistor 36. Accordingly, the cutoff frequencies $f_L$ and $f_H$ may be varied by controlling the impedance $Z_{36}$ to move the sloping line in FIG. 3 from the position $a$ to the position $b$. The curve $a$ is the response curve when the level of the signal applied to the input terminal 38 is small and therefore the impedance $Z_{36}$ is large. The response curve follows the sloping line $b$ when the input voltage applied to the terminal 38 is large and therefore the impedance $Z_{36}$ is small. At intermediate signal levels, the response curve is between the curves $a$ and $b$. It is important that changing the impedance $Z_{36}$ does not change the voltage levels $V_H$ and $V_L$ but only varies the location of the transition band between the frequencies $f_L$ and $f_H$.

The response of the filter is specifically indicated for two frequencies $f_1$ and $f_2$ within the transition band. The frequency $f_1$ is lower than the frequency $f_2$ and the response is always lower for the frequency $f_1$ than it is for the frequency $f_2$. However, the exact response at each of these frequencies depends on whether the level of the voltage applied to the terminal 38 is relatively high or low. For high input voltages to the terminal 38, the response at the frequency $f_1$ is at the lower level $V_L$.

The frequency-response curves in FIG. 3 are also representative of the overall frequency-response characteristic of the circuit when it is being used to record signals on the tape 23. In this case the arm of the switch 16 is thrown into contact with the terminal R and the output voltage of the amplifier 12 is simply modified by the frequency characteristic of the variable filter 17.

Figure 4:
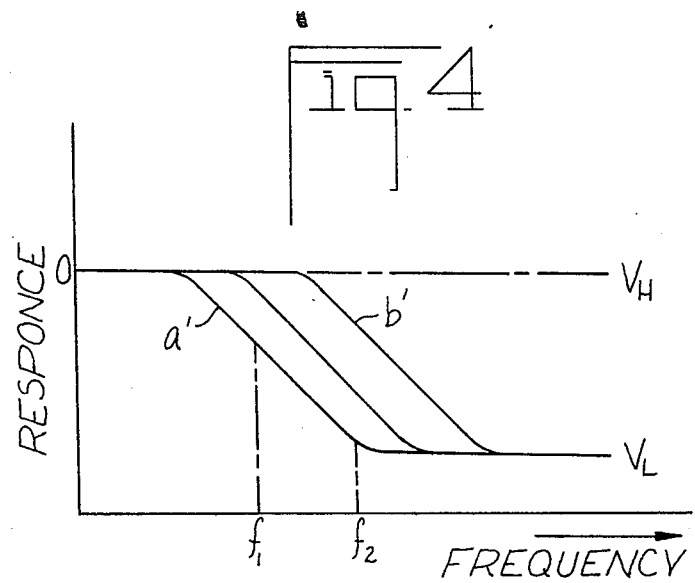
FIG. 4 is a frequency-response curve of the system of FIG. 1 when used as a reproducer.

On the other hand when the circuit is to be used to reproduce previously recorded signals, the terminal 11 receives the incoming signal from a magnetic pickup head, and the switch 16 is placed so that the arm is in the position shown in FIG. 1 in contact with the terminal P. The entire feedback loop for the high gain amplifier 12 then includes not only the resistor 14 but the variable filter 17 along with the compensating amplifier 19 and the attenuator 20. When the voltage fed back to the input circuit of the amplifier 12 is large, the output voltage is relatively small. Conversely, when the voltage fed back is relatively small, the output voltage is relatively large. Since the magnitude of the voltage fed back is determined by the frequency characteristics of the variable filter 17, the output voltage of the amplifier 12 in the playback mode of operation and measured at the terminal 13, will be as shown in FIG. 4, which is the converse of FIG. 3. In both FIGS. 3 and 4 the effect of a large input voltage to the terminal 38 in FIG. 2 is to shift the transition part of the curve to the right, i.e., to the line $b$ in FIG. 3 and to the line $b'$ in FIG. 4. Thus the recording and playback modes are compensated on a dynamic basis.

Figure 5:
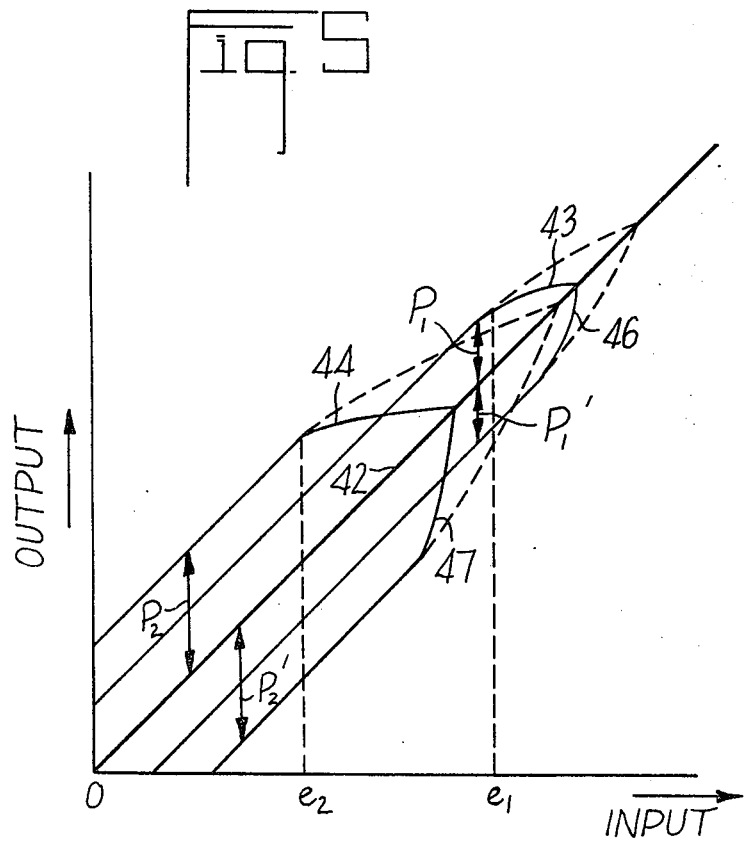
FIG. 5 is a graphical presentation of the input-output characteristics of the signal transmission system in FIG. 1.

FIG. 5 shows the relationship between the output and input of the information signals applied to the circuit of FIG. 1 for both modes of operation. The overall response, including both the recording and playback, is linear, which means that the amplitude of the output signal is a direct function of the amplitude of the input signal. This relationship is indicated by the line 42 in FIG. 5. The characteristics of the circuit of FIG. 1 operating as a recording system are indicated by the typical curves 43 and 44 above the line 42, and the matching curves 46 and 47 below the line 42, indicate the operation as a reproducer.

The overall frequency-response between the input terminal 11 in FIG. 1 and the system output terminal 21 presents the high-frequency band enhancing characteristic. As shown in FIG. 3, the cutoff frequency is raised as the level of the input signal increases. The result, as shown in FIG. 5, is that when the input signal level is small, the amplification of the system is raised by the amount $P_1$ over the original curve 42 and follows the curve 43. When the input signal level exceeds a point $e_1$, attenuation is initiated so that the response curve 43 approaches the original response characteristic 42. This is due to the fact that the transition band of the variable filter 17 shifts toward the position $b$ as shown in FIG. 3. This description corresponds to the case in which the information signal has a very low level and a frequency $f_1$ as indicated in FIG. 3.

However, for a higher frequency $f_2$ located substantially at the middle of the transition curve in FIG. 3, a higher level signal can be obtained as indicated by the curve 44. In this case the system has a higher gain $P_2$ than the gain $P_1$ for the lower frequency signal. The main amplifier 12 controls the variable filter 17 to cause the signal having the frequency $f_2$ to be amplified more than the signal having the frequency $f_1$, and control of the variable filter 17 is initiated at a lower level $e_2$ than the input signal level $e_1$. As a result the curve 44 starts to approach the characteristic curve 42 at a lower level. Thus the low amplitude, high frequency signal is amplified more than a lower frequency signal of the same level. The operation of the system in FIG. 1 as a reproducer is exactly the converse, as illustrated by the fact that the curves 46 and 47 are symmetrical with respect to the curves 43 and 44. This causes the higher frequency signal to be suppressed more in reproduction than a lower frequency signal. Thus it is possible for the signal-to-noise ratio to be improved by the reduction of high frequency hiss and the like.

FIG. 6 is a schematic circuit with some of the components of the block diagram of FIG. 1 indicated by corresponding reference numerals. The input of the control amplifier 18 is shown as being connected directly to the emitter of the transistor 36, which is, in effect, one of the output terminals of the filter circuit. The control amplifier 18 connected in this way shifts the operation of the circuit to the dotted lines in FIG. 5 as is desired.

The control amplifier 18 includes three transistor stages 54 to 56, the last of which has a collector load and an emitter load, the latter being divided into two series-connected resistors 61 and 62. A low-pass filter 57 feeds back the output of stage 55 to stage 54 to boost high-frequency response. The collector of the transistor 56 is connected through a relatively low capacitance capacitor 58 and a high resistance resistor 59 to the base of the transistor 36, which is, in effect the output terminal of the control amplifier. A diode rectifier 60 is connected to the common point between the capacitor 58 and the resistor 59.

A relatively high capacitance capacitor 63 connects the emitter of the transistor 56 to a rectifier 64. A high resistance resistor 65 connects this diode to the base of the transistor 36 and a diode 66 is connected between ground and the common point between the capacitor 63 and the diode 64. Another capacitor 67 which may have a high capacitance of approximately 100 microfarad or more, and a resistor 68 comprise a smoothing filter for the rectifier 64.

The operation of the control amplifier in FIG. 6 is such that when a signal having low or mid-range frequencies is applied to the input of the transistor 54, it is amplified and is rectified by the rectifier 64 to produce a voltage of one polarity to be used to control the impedance of the transistor 36. This rectified voltage is smoothed by the capacitor 67 and resistor 68.

When the voltage that reaches the base of the transistor 56 includes a negative transient, or rapidly varying signal, it produces a corresponding positive transient at the collector. The capacitance of the capacitor 58 is small, for example .005 microfarad, and this part of the circuit has a short attack time, so that the positive transient is applied across the resistor 65 to the base of the transistor 36. This transient is of the same polarity as voltage across the capacitor 67.

On the other hand, when a positive transient is applied to the base of the transistor 56, the collector goes negative, but this permits current to flow through the diode 60 to maintain the voltage applied to the resistor 59 constant. Thus, a positive transient applied to the base of the transistor 56 does not pass through the rectifying circuit that includes the capacitor 58, the resistor 59 and the diode 60.

In order to have such positive transients reach the base of the transistor 36, a third circuit path is provided. The main rectifier 64 produces a voltage across the capacitor 67 corresponding to the magnitude of the voltage across only part of the emitter load, the resistor 61. By emitter-follower operation, part of the positive transient at the base of the transistor 56 is reproduced across the resistor 62. The voltage across the capacitor 67 cannot change suddenly, and thus the positive transient across the resistor 62 is transmitted by the capacitor 67 and resistor 65 to the base of the transistor 36.

The effect of negative transients applied across the emitter loads 61 and 62 is all that remains to be considered. The diode 66 prevents these transients from varying the emitter voltage substantially, and so they do not conflict with the transients which, at that instant are being applied through the capacitor 58 to the base of the transistor 36.

Thus, both positive and negative transients are transmitted to the base of the transistor 36 but always in correct polarity to control the filter 17 to prevent transient distortion.

What is claimed is:

1. A circuit comprising:
    A. a rectifier to rectify lower frequency components of an incoming signal to produce an output signal having a predetermined polarity;
    B. a smoothing filter connected to said rectifier for smoothing out rapidly changing portions in said output signal;
    C. an output terminal connected to said filter for receiving said output signal therefrom; and
    D. circuit means nonresponsive to said lower frequency components to connect only rapidly changing portions of said incoming signal to said output terminal in said predetermined polarity regardless of the polarity of said rapidly changing portions.

2. The circuit of claim 1 in which said circuit means is connected to said output terminal in adding relation to said filter to add said rapidly changing portions to the output signal of said smoothing filter in said predetermined polarity.

3. The circuit of claim 1 comprising, in addition, means responsive to said incoming signal to produce corresponding signals of mutually opposite polarity, said rectifier being connected to said means to be energized by the lower frequency components of one of said corresponding signals, said circuit means comprising a unidirectional circuit responsive only to rapidly changing portions of the other of said corresponding signals.

4. A circuit comprising:
    a transistor responsive to an incoming signal for producing corresponding signals of mutually opposite polarity, said transistor having a base connected to receive said incoming signal,
    an emitter output circuit for one of said corresponding signals,
    and a collector output circuit for the other of said corresponding signals;
    a rectifier connected to one of said output circuits for rectifying one of said corresponding signals to produce an output signal having a predetermined polarity;
    a smoothing filter connected to said rectifier;
    an output terminal connected to said filter; and
    circuit means including a unidirectional circuit connected to the other of said output circuits and responsive to rapidly changing portions of the other of said corresponding signals for connecting said rapidly changing portions to said output terminal in said predetermined polarity.

5. The circuit of claim 4 in which said unidirectional circuit comprises:
    A. a capacitor;
    B. a second rectifier; and
    C. a resistor, said resistor and capacitor having a time constant to be responsive to signals of substantially higher frequency than said smoothing filter is.

6. The circuit of claim 5 in which said resistor is connected in parallel with said second rectifier and said capacitor is connected in series between said other of said output circuits and said parallel-connected resistor and second rectifier.

7. A circuit comprising:

a transistor having a base to receive an incoming signal;

first and second emitter load impedances connected in series, a rectifier connected to rectify the voltage across one of said emitter load impedances to produce an output signal having a predetermined polarity;

a smoothing filter connected to said rectifier;

an output terminal connected to said filter; and circuit means comprising a diode and the other of said emitter load impedances, said circuit means being connected in adding relation to said filter to add rapidly changing portions of said incoming signal to the output signal of said filter in said predetermined polarity.

8. The circuit of claim 7 in which said rectifier is connected to rectify the voltage across the one of said emitter load impedances closer to the emitter of said transistor.

9. The circuit of claim 8 comprising, in addition, a capacitor connected in series with said rectifier, one electrode of said diode being connected to a common point between said capacitor and said rectifier and the other electrode of said diode being connected to the remote end of said other of said emitter load impedances.

10. The circuit of claim 9 comprising in addition:

A. a collector load for said transistor; and

B. an additional rectifying circuit connected to the collector of said transistor, said smoothing filter comprising a second capacitor, said additional rectifying circuit comprising a third capacitor of much smaller capacitance than said second capacitor, said additional rectifying circuit being additively connected to said smoothing filter and said other of said load impedances, whereby rapidly changing portions of said incoming signal in one polarity are rectified by said additional rectifying circuit add in the same polarity to the output signal of said smoothing filter of said output terminal, and rapidly changing portions of said incoming signal in the opposite polarity across said other of said emitter load impedances add in the same polarity to the output signal of said smoothing filter at said output terminal.

11. A circuit comprising:

a rectifier to rectify lower frequency components of an incoming signal to produce an output signal having a predetermined polarity;

a smoothing filter connected to said rectifier;

an output terminal connected to said filter for receiving said output signal therefrom; and circuit means for supplying only rapidly changing portions in said incoming signal directly to said output terminal, said circuit means being nonresponsive to said lower frequency components and having a short attack time in comparison with that of said smoothing filter such that said circuit means connects only rapidly changing portions of said incoming signal to said output terminal in said predetermined polarity.

* * * * *